(12) United States Patent
Alberkrack et al.

(10) Patent No.: US 7,576,396 B2
(45) Date of Patent: Aug. 18, 2009

(54) SYNCHRONOUS SUBSTRATE INJECTION CLAMP

(75) Inventors: Jade H. Alberkrack, Tempe, AZ (US);
David L. Cave, Tempe, AZ (US);
Thomas Peter Bushey, Mesa, AZ (US);
Robert Alan Brannen, Chandler, AZ (US)

(73) Assignee: Dolpan Audio, LLC, Dover, DE (US)

( * ) Notice: Subject to any disclaimer, the term of this patent is extended or adjusted under 35 U.S.C. 154(b) by 362 days.

(21) Appl. No.: 11/492,701

(22) Filed: Jul. 25, 2006

(65) Prior Publication Data

US 2008/0023768 A1    Jan. 31, 2008

(51) Int. Cl.
*H01L 29/72* (2006.01)
(52) U.S. Cl. .................. 257/355; 257/173; 327/409; 388/800
(58) Field of Classification Search .................. 257/173, 257/355; 327/409; 388/800
See application file for complete search history.

(56) References Cited

U.S. PATENT DOCUMENTS 4,256,979 A * 3/1981 Hendrickson et al. ....... 327/409

* cited by examiner

*Primary Examiner*—Edward Wojciechowicz
(74) *Attorney, Agent, or Firm*—Knobbe Martens Olson & Bear LLP

(57) ABSTRACT

In accordance with the principles of the invention, an integrated circuit comprises a substrate having a first FET formed on the substrate. The first FET has a first terminal coupleable to a load, a second terminal and a control terminal. The second terminal is connected to the substrate. The substrate comprises a parasitic body diode coupled between the first terminal and the substrate. The body diode is disposed such that it becomes conductive when a reverse voltage across the FET first terminal and the substrate is at least a first diode forward voltage. A voltage detector is formed on the substrate. The voltage detector has a first input coupled to the FET first terminal, a second input coupled to the substrate, and an output coupled to the FET control terminal. The voltage detector is responsive to a reverse voltage level at the FET first terminal that is less than the first diode forward voltage to turn the FET on for the duration of a reverse voltage having at least said reverse voltage level. The parasitic body diode is thereby prevented from injecting current into the substrate.

11 Claims, 2 Drawing Sheets

SYNCHRONOUS SUBSTRATE INJECTION CLAMP

FIELD OF THE INVENTION

The invention pertains to semiconductor devices, in general, and to a substrate injection clamp for preventing undesirable current injection into the substrate of an integrated circuit.

BACKGROUND OF THE INVENTION

Typical integrated circuit motor drive chips utilized to drive direct current motors with a pulse width modulated signal include two FETs. The FETs are operated such that when one FET switches on, the other FET switches off. The FET that switches on draws current from the voltage source through the motor winding to ground. The motor behaves as a mutually coupled inductance. The result is that a high reverse polarity voltage is applied to the FET that has switched off.

Each FET has an internal parasitic body diode across its drain-source. When a reverse polarity voltage is applied to the drain that exceeds the voltage drop of the body diode, the body diode becomes forward biased and a large current flows or is "injected" into the substrate. As the one FET draws current from the voltage source through its motor winding to ground, the body diode associated with the other FET causes substrate injection to occur.

One prior solution to the substrate injection problem is to utilize an external Schottky diode across each FET. The external Schottky diode is selected to have a lower voltage drop than the internal parasitic body diode of the FET. When a voltage spike occurs across a FET, the Schottky diode conducts thereby clamping the voltage across the FET to a voltage lower than that which will forward bias the body diode and preventing current injection into the substrate.

It is desirable to provide a structure in which injection of substrate current is prevented and that does not require use of an external diode clamp.

SUMMARY OF THE INVENTION

In accordance with the principles of the invention, an integrated circuit comprises a substrate having a first FET formed on the substrate. The first FET has a first terminal coupleable to a load, a second terminal and a control terminal. The second terminal is connected to the substrate. The substrate comprises a parasitic body diode coupled between the first terminal and the substrate. The body diode is disposed such that it becomes conductive when a reverse voltage across the FET first terminal and the substrate is at least a first diode forward voltage. A voltage detector is formed on the substrate. The voltage detector has a first input coupled to the FET first terminal, a second input coupled to the substrate, and an output coupled to the FET control terminal. The voltage detector is responsive to a reverse voltage level at the FET first terminal that is less than the first diode forward voltage to turn the FET on for the duration of a reverse voltage having at least said reverse voltage level. The parasitic body diode is thereby prevented from injecting current into the substrate.

Further in accordance with the principles of the invention, an integrated motor circuit for selectively coupling at least two windings of a motor to a voltage source of direct current power comprises a substrate with a first FET formed on the substrate. The first FET comprises a first terminal coupleable to a first winding of the motor, a second terminal and a control terminal, the second terminal is connected to the substrate. The substrate comprises a parasitic body diode coupled between said first FET first terminal and the substrate. The body diode becomes conductive when a reverse voltage across the first FET first terminal and the substrate is at least a diode forward voltage. A first voltage detector is formed on the substrate. The first voltage detector generates a first input coupled to the first FET first terminal, a second input coupled to the substrate, and an output coupled to the first FET control terminal. The first voltage detector is responsive to a reverse voltage level at the first FET first terminal that is less than the diode forward voltage to turn the first FET on for the duration of a reverse voltage having at least the reverse voltage level, whereby the parasitic body diode is prevented from injecting current into the substrate.

Still further in accordance with the principles of the invention a second FET is formed on the substrate. The second FET comprises a first terminal coupleable to a second winding of the motor, a second terminal and a control terminal. The second terminal is connected to the substrate. The substrate comprises a second parasitic body diode coupled between the second FET first terminal and the substrate. The second body diode becomes conductive when a reverse voltage across the second FET first terminal and the substrate is at least the diode forward voltage. A second voltage detector is formed on the substrate. The second voltage detector has a first input coupled to the second FET first terminal, a second input coupled to the substrate, and an output coupled to the second FET control terminal. The second voltage detector is responsive to a reverse voltage level at the second FET first terminal that is less than the first diode forward voltage to turn the second FET on for the duration of a reverse voltage having at least the reverse voltage level. The parasitic body diode is thereby prevented from injecting current into the substrate.

BRIEF DESCRIPTION OF THE DRAWING

The invention will be better understood from a reading of the following detailed description of a preferred embodiment of the invention in conjunction with the drawing figures in which like reference designations are utilized to designate like elements, and in which.

DETAILED DESCRIPTION

The term "N-MOS" as used herein refers to MOS components that reside in regions of an integrated circuit substrate that have been doped with positively charged impurities. The term "P-MOS" as used herein refers to MOS components that reside in regions of an integrated circuit substrate that have been doped with negatively charged impurities.

Figure 1:
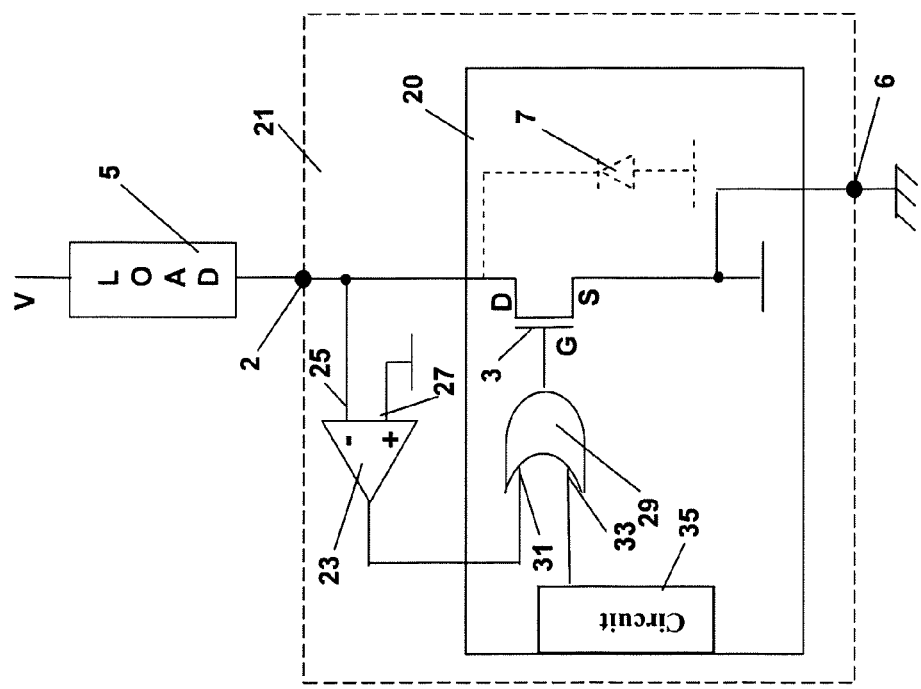
FIG. 1 illustrates a prior art solution to providing substrate injection clamping.

Turning now to FIG. 1, a prior art solution to the problem of substrate injection is shown. A motor drive circuit includes a power N-MOS FET 3 that is formed on a substrate 1. Substrate 1 typically includes other circuitry formed thereon for providing drive signals to the gate G of FET 3. A parasitic body diode 7 is formed on the substrate across the drain D and source S of FET 3. FET 3 has its drain D coupled via a terminal 2 to load 5. FET 3 has its source S formed on and electrically coupled to substrate 1. FET 3 is coupled to a load 5 via a terminal 2.

The prior art solution to preventing the parasitic body diode 7 from conducting and injecting current into substrate 1 is to couple an external Schottky diode across the FET. In the prior art solution shown, Schottky diode 9 is connected to terminals 2 and 6. Schottky diode 9 is external to substrate 1. Schottky diode 9 is selected to have a lower forward voltage drop than that of the body diode 7. When FET 3 is off, if the voltage at the drain D goes below ground, the external Schottky diode 9 conducts and clamps drain D to the forward voltage drop of Schottky diode 9, thereby preventing the injection of a substrate current via body diode 7.

Figure 2:
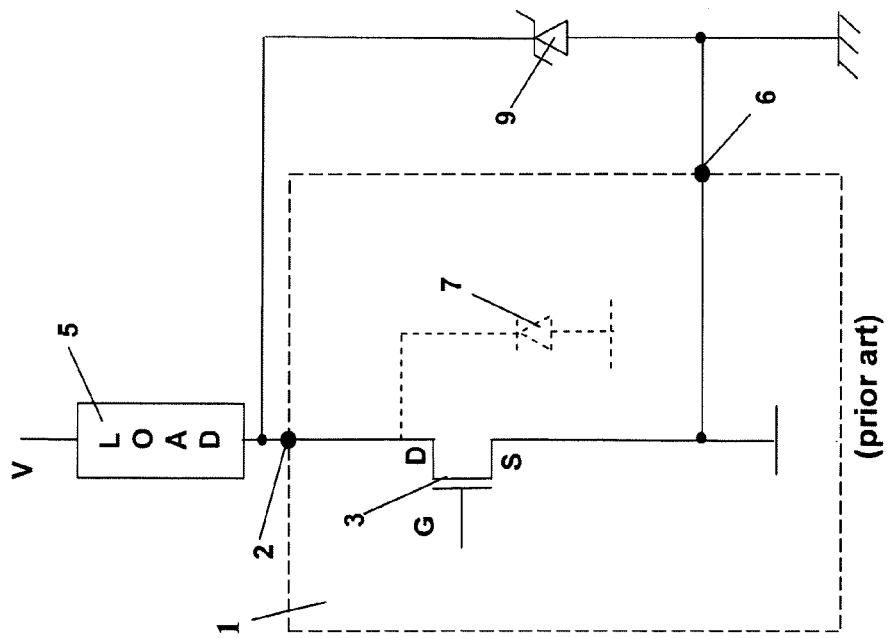
FIG. 2 is a simplified diagram illustrating a preferred embodiment of the invention.

In an embodiment in accordance with the principles of the invention shown in FIG. 2, a high power N-MOS FET 3 is part of a motor drive circuit 20 formed on a chip or substrate 21. Only that portion of the motor drive circuit 20 needed for an understanding of the present invention is shown.

A load 5 is coupled to motor drive circuit 20 via terminal or pad 2. A switched conductive path from a voltage source V connected to load 5 is completed to the ground of the voltage source via terminal or pad 6. The switched conductive path includes FET 3 having a first or drain terminal D coupled to load 5 via pad 2 and a second or source terminal S coupled to the substrate 21 and connected to the other terminal or ground of the of the voltage source via pad 6. A control or gate terminal G of FET 3 is used to switch FET 3 between conductive and non-conductive states. A parasitic body diode 7 exists across the first terminal D and second terminal S of FET 3.

A voltage comparator or detector 23 is formed on the substrate 21. Voltage comparator or detector 23 has a first input coupled to FET first terminal D and a second input coupled to the substrate. Voltage comparator 23 has an output coupled to the control terminal G of FET 3 via one input 31 of a gate 29. Gate 29 has another input 33 that is coupled to the other portions 35 of motor drive circuit 20 that selectively cause FET 3 to become conductive and non-conductive. Voltage comparator 23 provides a signal at its output that operates such that when the voltage at the first terminal D is a reverse voltage, voltage comparator 23 will provide a gating signal at its output. The voltage level at which voltage comparator 23 operates is selected to be less than the forward voltage drop of body diode 7.

When a reverse voltage pulse such as an inductively induced pulse occurs at the first terminal D of FET 3, voltage detector 23 detects the reverse voltage before it reaches the forward voltage drop of body diode 7 and generates a signal that is coupled via gate 31 to control terminal G of FET 3 to cause FET 3 to become conductive. Voltage detector 23, in effect utilizes FET 3 to prevent current injection via body diode 3 into substrate 21.

Figure 3:
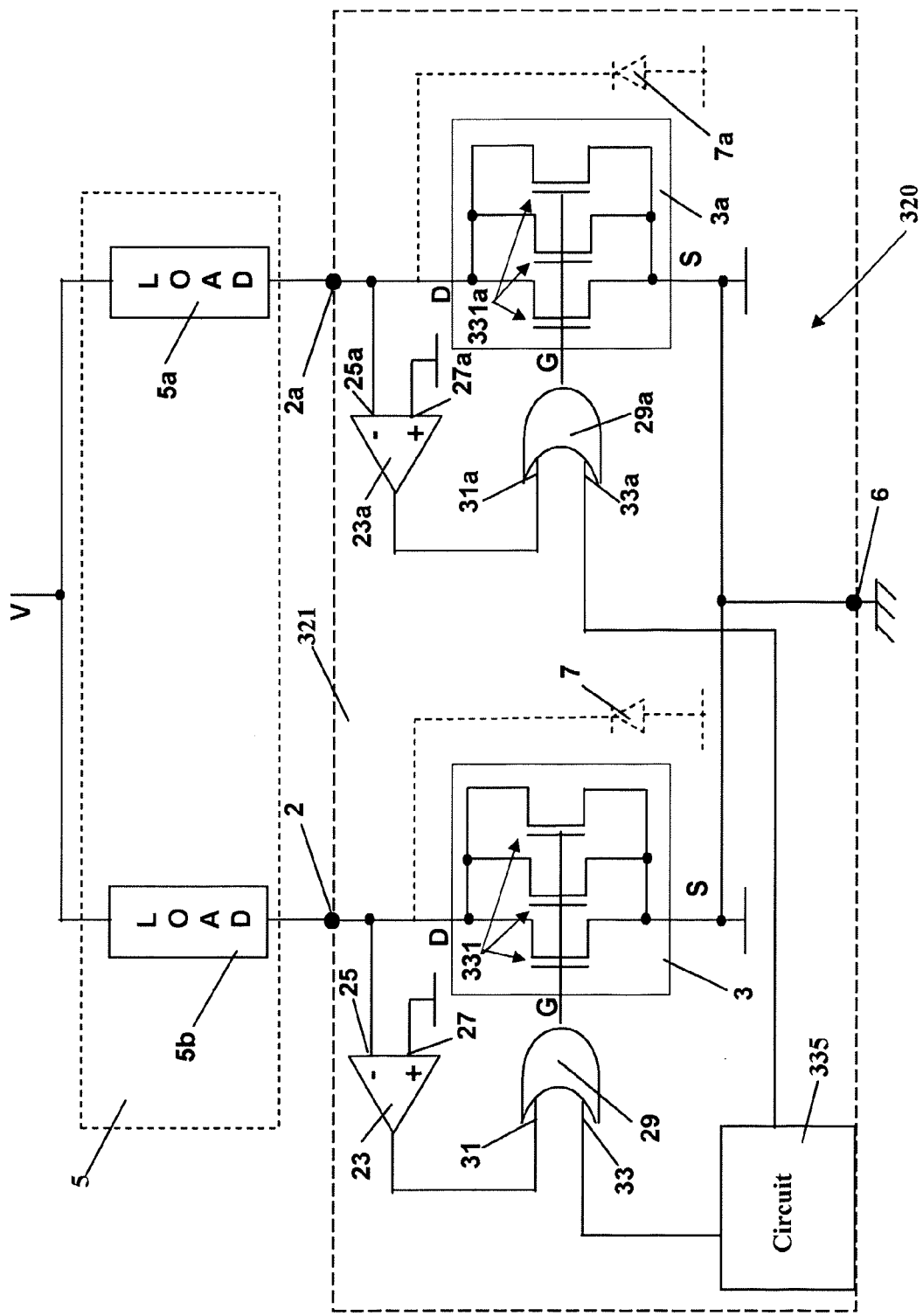
FIG. 3 illustrates a second embodiment of the invention.

Turning now to FIG. 3, a motor drive circuit 320 is formed on a substrate 321. Motor drive circuit 320 is connected to a load 5 that comprises first and second motor windings or loads 5a, 5b. Motor drive circuit 320 includes a first power FET 3 having a first or drain terminal D coupled to a first load 5a via a terminal or pad 2. FET 3 has a second or source terminal S coupled to the substrate 321 and coupleable to a voltage source second or ground terminal at pad 6. FET 3 is comprised of a plurality of individual FET cells 331 to provide higher current handling capability. Each cell 331 has its terminals connected in common with like terminals of the other cell or cells. Although three cells 331 are shown, it will be appreciated by those skilled in the art that the number of cells 331 may be more or less than three.

A parasitic body diode 7 exists in substrate 321 across the first terminal D and second terminal S of FET 3.

A first voltage comparator or detector 23 is formed on the substrate 321. First voltage comparator or detector 23 has a first input coupled to FET 3 first terminal D and a second input coupled to substrate 321. Voltage comparator 23 has an output coupled to the control terminal G of FET 3 via one input 31 of a gate 29. Gate 29 has another input 33 that is coupled to the other portions 335 of motor drive circuit 320 that selectively cause FET 3 to become conductive and non-conductive. Voltage comparator 23 provides a signal at its output that operates such that when the voltage at the first terminal D is a reverse voltage, voltage comparator 23 will provide a gating signal at its output. The voltage level at which voltage comparator 23 operates is selected to be less than the. forward voltage drop of body diode 7.

When a reverse voltage pulse such as an inductively induced pulse from winding. 5a occurs at the first terminal D of FET 3, voltage detector 23 detects the reverse voltage before it reaches the forward voltage drop of body diode 7 and generates a signal that is coupled via gate 31 to control terminal G of FET 3 to cause FET 3 to become conductive.

Motor drive circuit 320 includes a second power FET 3a having a first or drain terminal D coupled to a second load 5b via a terminal or pad 2a. FET 3a has a second or source terminal S coupled to the substrate 321 and coupleable to a voltage source second or ground terminal at pad 6. FET 3 is comprised of a plurality of individual FET cells 331a to provide higher current handling capability. Each cell 331a has its terminals connected in common with like terminals of the other cell or cells. Although three cells 331a are shown, it will be appreciated by those skilled in the art that the number of cells 331a may be more or less than three.

A parasitic body diode 7a exists in substrate 321 across the first terminal D and second terminal S of FET 3a.

A second voltage comparator or detector 23a is formed on the substrate 321. Second voltage comparator or detector 23 has a first input coupled to FET 3a first terminal D and a second input coupled to substrate 321. Voltage comparator 23a has an output coupled to the control terminal G of FET 3 via one input 31a of a gate 29a. Gate 29a has another input 33a that is coupled to the other circuit portions 335 of motor drive circuit 320 that selectively cause FET 3a to become conductive and non-conductive. Voltage comparator 23a provides a signal at its output that operates such that when the voltage at the first terminal D of FET 3a is a reverse voltage, voltage comparator 23a will provide a gating signal at its output. The voltage level at which voltage comparator 23a operates is selected to be less than the forward voltage drop of body diode 7a.

When a reverse voltage pulse such as an inductively induced pulse from winding 5b occurs at the first terminal D of FET 3a, voltage detector 23a detects the reverse voltage before it reaches the forward voltage drop of body diode 7a and generates a signal that is coupled via gate 31a to control terminal G of FET 3a to cause FET 3a to become conductive.

The invention has been described in conjunction with illustrative embodiments. It will be appreciated by those skilled in the art that various changes may be made to the embodiments shown and described without departing from the spirit or scope of the invention. By way of non-limiting example, although the invention has been described in terms of N-MOS type FET transistors, the principles of the invention apply equally well to embodiments in which P-MOS type FET transistors or other transistors or semiconductor switching devices are utilized.

It is not intended that the invention be limited in any manner to the specific embodiments shown and described. It is intended that the invention only be limited by the claims appended hereto.

What is claimed is:

1. An integrated circuit comprising:
   a substrate;
   a first FET formed on said substrate, said first FET comprising a first terminal coupleable to a load, a second terminal and a control terminal, said second terminal being connected to said substrate;
   said substrate comprising a parasitic body diode coupled between said first FET first terminal and said substrate, said body diode becoming conductive when a reverse voltage across said first FET first terminal and said substrate is at least a first diode forward voltage; and
   a first voltage detector formed on said substrate, said first voltage detector having a first input coupled to said first FET first terminal, a second input coupled to said substrate, and an output coupled to said first FET control terminal, said first voltage detector being responsive to a reverse voltage level at said first FET first terminal less than said first diode forward voltage to turn said first FET on for the duration of a reverse voltage having at least said reverse voltage level, whereby said parasitic body diode is prevented from injecting current into said substrate.

2. The integrated circuit in accordance with claim 1, wherein said first FET is a N-MOS type FET, said first terminal is a drain and said second terminal is a source.

3. The integrated circuit in accordance with claim 1, comprising a first terminal formed on said substrate for coupling to a load, said first terminal being coupled to said first FET first terminal.

4. The integrated circuit in accordance with claim 1, comprising control circuitry formed on said substrate, said control circuitry coupled to said first FET to control operation thereof.

5. The integrated circuit in accordance with claim 4, wherein said control circuitry comprises a gate coupling said control circuitry and said first voltage detector output to said first FET control terminal.

6. An integrated circuit motor drive circuit for selectively coupling at least two windings of a motor to a voltage source of direct current power, said motor drive circuit comprising:
   a substrate;
   a first FET formed on said substrate, said first FET comprising a first terminal coupleable to a first winding of said motor, a second terminal and a control terminal, said first FET second terminal being connected to said substrate;
   said substrate comprising a parasitic body diode coupled between said first FET first terminal and said substrate, said body diode becoming conductive when a reverse voltage across said first FET first terminal and said substrate is at least a diode forward voltage; and
   a first voltage detector formed on said substrate, said first voltage detector having a first input coupled to said first FET first terminal, a second input coupled to said substrate, and an output coupled to said first FET control terminal, said first voltage detector being responsive to a reverse voltage level at said first FET first terminal that is less than said diode forward voltage to turn said first FET on for the duration of a reverse voltage having at least said reverse voltage level, whereby said parasitic body diode is prevented from injecting current into said substrate.

7. The integrated circuit in accordance with claim 6, comprising:
   a second FET formed on said substrate, said second FET comprising a first terminal coupleable to a second winding of said motor, a second terminal and a control terminal, said second FET second terminal being connected to said substrate;
   said substrate comprising a second parasitic body diode coupled between said second FET first terminal and said substrate, said second body diode becoming conductive when a reverse voltage across said second FET first terminal and said substrate is at least said diode forward voltage; and
   a second voltage detector formed on said substrate, said second voltage detector having a first input coupled to said second FET first terminal, a second input coupled to said substrate, and an output coupled to said second FET control terminal, said second voltage detector being responsive to a reverse voltage level at said second FET first terminal that is less than said first diode forward voltage to turn said second FET on for the duration of a reverse voltage having at least said reverse voltage level, whereby said parasitic body diode is prevented from injecting current into said substrate.

8. The integrated circuit in accordance with claim 7, comprising a motor control circuit formed on said substrate, said motor control circuit selectively switching each of said first FET and said second FET on and off.

9. The integrated circuit in accordance with claim 8, comprising:
   first logic circuitry disposed between said motor control circuit and said first FET control terminal and between said first voltage detector and said first FET control terminal; and
   second logic circuitry disposed between said motor control circuit and said second FET control terminal and between said second voltage detector and said second FET control terminal.

10. The integrated circuit in accordance with claim 9, comprising:
    a first connection terminal formed on said substrate, said first connection terminal coupled to said first FET first terminal;
    a second connection terminal formed on said substrate, said second connection terminal coupled to said second FET first terminal; and
    a third connection terminal formed on said substrate, said third connection terminal coupled to said substrate and to said first FET second terminal and said second FET second terminal.

11. The integrated circuit in accordance with claim 7, wherein said first FET and said second FET are each N-MOS type, said first and second FET first terminals are each drain terminals, and said first and second FET second terminals are each source terminals.

* * * * *

UNITED STATES PATENT AND TRADEMARK OFFICE
CERTIFICATE OF CORRECTION

PATENT NO. : 7,576,396 B2  Page 1 of 1
APPLICATION NO. : 11/492701
DATED : August 18, 2009
INVENTOR(S) : Alberkrack et al.

It is certified that error appears in the above-identified patent and that said Letters Patent is hereby corrected as shown below:

At Column 4, Line 17, please delete "winding." and insert therefore, --winding--.

Signed and Sealed this

Sixteenth Day of March, 2010

David J. Kappos
*Director of the United States Patent and Trademark Office*